United States Patent
Luthra

(10) Patent No.: US 9,019,788 B2
(45) Date of Patent: *Apr. 28, 2015

(54) TECHNIQUES FOR ACCESSING MEMORY CELLS

(71) Applicant: Micron Technology, Inc., Boise, ID (US)

(72) Inventor: Yogesh Luthra, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/324,586

(22) Filed: Jul. 7, 2014

(65) Prior Publication Data

US 2014/0321218 A1    Oct. 30, 2014

Related U.S. Application Data

(63) Continuation of application No. 13/422,870, filed on Mar. 16, 2012, now Pat. No. 8,773,933.

(51) Int. Cl.
*G11C 7/00* (2006.01)
*G11C 7/12* (2006.01)
*G11C 11/404* (2006.01)
(Continued)

(52) U.S. Cl.
CPC .............. *G11C 7/12* (2013.01); *G11C 11/404* (2013.01); *G11C 11/4085* (2013.01); *G11C 11/4094* (2013.01); *G11C 2211/4016* (2013.01); *G11C 7/10* (2013.01)

(58) Field of Classification Search
USPC ................................ 365/203, 189.02, 230.06
See application file for complete search history.

(56) References Cited

U.S. PATENT DOCUMENTS 3,439,214 A    4/1969 Kabell
3,997,799 A    12/1976 Baker
(Continued)

FOREIGN PATENT DOCUMENTS

CA    272437 A    7/1927
EP    030856 A1    6/1981
(Continued)

OTHER PUBLICATIONS

Arimoto et al., A Configurable Enhanced T2RAM Macro for System-Level Power Management Unified Memory, 2006, VLSI Symposium, 2 pages.
(Continued)

*Primary Examiner* — Huan Hoang
(74) *Attorney, Agent, or Firm* — Wilmer Cutler Pickering Hale and Dorr LLP

(57) ABSTRACT

Techniques for accessing memory cells are disclosed. In one particular embodiment, the techniques may be realized as an apparatus providing voltage to a high impedance node of a memory cell. The apparatus may comprise a precharge switch coupled to a first voltage source node, a precharge capacitor coupled to the precharge switch, and a switch matrix coupled to the precharge capacitor, a second voltage source node, and the high impedance node of the memory cell. The precharge switch may be configured to decouple the precharge capacitor from the first voltage source node, and the switch matrix may be configured to decouple the second voltage source node from the high impedance node of the memory cell and to couple the precharge capacitor to the high impedance node of the memory cell.

20 Claims, 8 Drawing Sheets

(51) Int. Cl.
  *G11C 11/408* (2006.01)
  *G11C 11/4094* (2006.01)
  *G11C 7/10* (2006.01)

(56) References Cited

U.S. PATENT DOCUMENTS

| | | |
|---|---|---|
| 4,032,947 A | 6/1977 | Kesel et al. |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki et al. |
| 4,630,089 A | 12/1986 | Sasaki et al. |
| 4,658,377 A | 4/1987 | McElroy |
| 4,791,610 A | 12/1988 | Takemae |
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa et al. |
| 5,355,330 A | 10/1994 | Hisamoto et al. |
| 5,388,068 A | 2/1995 | Ghoshal et al. |
| 5,397,726 A | 3/1995 | Bergemont |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidaka et al. |
| 6,048,756 A | 4/2000 | Lee et al. |
| 6,081,443 A | 6/2000 | Morishita et al. |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,133,752 A | 10/2000 | Kawagoe |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,229,161 B1 | 5/2001 | Nemati et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes et al. |
| 6,538,916 B2 | 3/2003 | Ohsawa |
| 6,544,837 B1 | 4/2003 | Divakauni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portman et al. |

(56) References Cited

U.S. PATENT DOCUMENTS

| | | |
|---|---|---|
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi et al. |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller et al. |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 8,264,041 B2 | 9/2012 | Okhonin |
| 8,773,933 B2* | 7/2014 | Luthra ................. 365/203 |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee et al. |
| 2004/0029335 A1 | 2/2004 | Lee et al. |
| 2004/0075143 A1 | 4/2004 | Bae et al. |
| 2004/0108532 A1 | 6/2004 | Forbes |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0084247 A1 | 4/2006 | Liu |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida et al. |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Deml et al. |
| 2008/0165577 A1 | 7/2008 | Fazan et al. |
| 2008/0205184 A1 | 8/2008 | Tsukude |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |
| 2011/0299317 A1 | 12/2011 | Shaeffer et al. |

FOREIGN PATENT DOCUMENTS

| | | | |
|---|---|---|---|
| EP | 175378 | A2 | 3/1986 |
| EP | 202515 | A1 | 11/1986 |
| EP | 207619 | A1 | 1/1987 |
| EP | 245515 | A1 | 11/1987 |
| EP | 253631 | A2 | 1/1988 |
| EP | 300157 | A2 | 1/1989 |
| EP | 333426 | A1 | 9/1989 |
| EP | 350057 | A1 | 1/1990 |
| EP | 354348 | A2 | 2/1990 |
| EP | 359551 | A2 | 3/1990 |
| EP | 362961 | A1 | 4/1990 |
| EP | 366882 | A2 | 5/1990 |

(56) References Cited

FOREIGN PATENT DOCUMENTS

| EP | 465961 A1 | 1/1992 |
|---|---|---|
| EP | 510607 A1 | 10/1992 |
| EP | 513923 A2 | 11/1992 |
| EP | 537677 A2 | 4/1993 |
| EP | 564204 A2 | 10/1993 |
| EP | 579566 A2 | 1/1994 |
| EP | 599388 A1 | 6/1994 |
| EP | 599506 A1 | 6/1994 |
| EP | 601590 A2 | 6/1994 |
| EP | 606758 A1 | 7/1994 |
| EP | 642173 A1 | 3/1995 |
| EP | 682370 A1 | 11/1995 |
| EP | 689252 A1 | 12/1995 |
| EP | 694977 A2 | 1/1996 |
| EP | 725402 A2 | 8/1996 |
| EP | 726601 A1 | 8/1996 |
| EP | 727820 A1 | 8/1996 |
| EP | 727822 A2 | 8/1996 |
| EP | 731972 A1 | 9/1996 |
| EP | 739097 A2 | 10/1996 |
| EP | 744772 A1 | 11/1996 |
| EP | 788165 A2 | 8/1997 |
| EP | 801427 A2 | 10/1997 |
| EP | 836194 A2 | 4/1998 |
| EP | 844671 A1 | 5/1998 |
| EP | 858109 A2 | 8/1998 |
| EP | 860878 A2 | 8/1998 |
| EP | 869511 A2 | 10/1998 |
| EP | 878804 A2 | 11/1998 |
| EP | 920059 A2 | 6/1999 |
| EP | 924766 A2 | 6/1999 |
| EP | 933820 A1 | 8/1999 |
| EP | 951072 A1 | 10/1999 |
| EP | 971360 A1 | 1/2000 |
| EP | 980101 A2 | 2/2000 |
| EP | 993037 A2 | 4/2000 |
| EP | 1073121 A2 | 1/2001 |
| EP | 1162663 A2 | 12/2001 |
| EP | 1162744 A1 | 12/2001 |
| EP | 1179850 A2 | 2/2002 |
| EP | 1180799 A2 | 2/2002 |
| EP | 1191596 A2 | 3/2002 |
| EP | 1204146 A1 | 5/2002 |
| EP | 1204147 A1 | 5/2002 |
| EP | 1209747 A2 | 5/2002 |
| EP | 1233454 A2 | 8/2002 |
| EP | 1237193 A2 | 9/2002 |
| EP | 1241708 A2 | 9/2002 |
| EP | 1253634 A2 | 10/2002 |
| EP | 1280205 A2 | 1/2003 |
| EP | 1288955 A2 | 3/2003 |
| FR | 2197494 A5 | 3/1974 |
| GB | 1414228 A | 11/1975 |
| JP | S62-007149 | 1/1987 |
| JP | 62-272561 A | 11/1987 |
| JP | 02-294076 A | 12/1990 |
| JP | 03-171768 A | 7/1991 |
| JP | H04-176163 U | 6/1992 |
| JP | 05-347419 A | 12/1993 |
| JP | 08-213624 A | 8/1996 |
| JP | 08-274277 A | 10/1996 |
| JP | H08-316337 | 11/1996 |
| JP | 09-046688 A | 2/1997 |
| JP | 09-082912 A | 3/1997 |
| JP | 10-242470 A | 9/1998 |
| JP | 11-087649 A | 3/1999 |
| JP | 12-247735 | 8/2000 |
| JP | 12-274221 A | 9/2000 |
| JP | 12-389106 A | 12/2000 |
| JP | 13-180633 A | 6/2001 |
| JP | 2002-009081 A | 1/2002 |
| JP | 2002-083945 A | 3/2002 |
| JP | 2002-094027 A | 3/2002 |
| JP | 2002-176154 A | 6/2002 |
| JP | 2002-246571 A | 8/2002 |
| JP | 2002-329795 A | 11/2002 |
| JP | 2002-343886 A | 11/2002 |
| JP | 2002-353080 A | 12/2002 |
| JP | 2003-031693 A | 1/2003 |
| JP | 2003-68877 | 3/2003 |
| JP | 2003-086712 A | 3/2003 |
| JP | 2003-100641 A | 4/2003 |
| JP | 2003-100900 A | 4/2003 |
| JP | 2003-132682 A | 5/2003 |
| JP | 2003-203967 A | 7/2003 |
| JP | 2003-243528 A | 8/2003 |
| JP | 2004-335553 A | 11/2004 |
| WO | WO-01/24268 A1 | 4/2001 |
| WO | WO-2005/008778 A1 | 1/2005 |

OTHER PUBLICATIONS

Arimoto, A High-Density Scalable Twin Transistor RAM (TTRAM) With Verify Control for SOI Platform Memory IPs, Nov. 2007, IEEE J. Solid-State Circuits, vol. 22, No. 11, p. 2611-2619.

Asian Technology Information Program (ATIP) Scoops ™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, p. 809-812.

Assaderaghi et al., "A Dynamic Threshold Voltage MOSFET (DTMOS) for Very Low Voltage Operation", IEEE Electron Device Letters, vol. 15, No. 12, Dec. 1994, p. 510-512.

Assaderaghi et al., "A Novel Silicon-On-Insulator (SOI) MOSFET for Ultra Low Voltage Operation", 1994 IEEE Symposium on Low Power Electronics, p. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, p. 414-422.

Assaderaghi et al., "High-Field Transport of Inversion-Layer Electrons and Holes Including Velocity Overshoot", IEEE Transactions on Electron Devices, vol. 44, No. 4, Apr. 1997, p. 664-671.

Avci, Floating Body Cell (FBC) Memory for 16-nm Technology with Low Variation on Thin Silicon and 10-nm BOX, Oct. 2008, SOI Conference, 2 pages.

Bae, Evaluation of 1T RAM using Various Operation Methods with SOONO (Silicon-On-ONO) device, Dec. 2008, IEDM, p. 805-808.

Ban et al., Integration of Back-Gate Doping for 15-nm Node Floating Body Cell (FBC) Memory, Components Research, Process Technology Modeling, presented in the 2010 VLSI Symposium on Jun. 17, 2010, 2 pages.

Ban, A Scaled Floating Body Cell (FBC) Memory with High-k+Metal Gate on Thin-Silicon and Thin-BOX for 16-nm Technology Node and Beyond, Jun. 2008, VLSI Symposium, p. 92-93.

Ban, Ibrahim, et al., "Floating Body Cell with Independently-Controlled Double Gates for High Density Memory," Electron Devices Meeting, 2006. IEDM '06. International, IEEE, p. 1-4, Dec. 2006.

Bawedin, Maryline, et al., A Capacitorless 1T Dram on SOI Based on Dynamic Coupling and Double-Gate Operation, IEEE Electron Device Letters, vol. 29, No. 7, Jul. 2008, p. 795-798.

Blagojevic et al., Capacitorless 1T DRAM Sensing Scheme Automatice Reference Generation, IEEE J.Solid State Circuits, vol. 41, No. 6, pp. 1463-1470, 2006.

Blalock, T., "A High-Speed Clamped Bit-Line Current-Mode Sense Amplifier", IEEE Journal of Solid-State Circuits, vol. 26, No. 4, Apr. 1991, p. 542-548.

Butt, Scaling Limits of Double Gate and Surround Gate Z-RAM Cells, IEEE Trans. Elec. Dev., vol. 54, No. 9, p. 2255-2262, Sep. 2007.

Chan et al., "Effects of Floating Body on Double Polysilicon Partially Depleted SOI Nonvolatile Memory Cell", IEEE Electron Device Letters, vol. 24, No. 2, Feb. 2003, p. 75-77.

Chan, et al., "SOI MOSFET Design for All-Dimensional Scaling with Short Channel, Narrow Width and Ultra-thin Films", IEEE IEDM, 1995, pp. 631-634.

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.

(56) References Cited

OTHER PUBLICATIONS

Cho et al., "Novel DRAM Cell with Amplified Capacitor for Embedded Application", IEEE, Jun. 2009, p. 11.2.1-11.2.4.
Cho, A novel capacitor-less DRAM cell using Thin Capacitively-Coupled Thyristor (TCCT), 2005, IEDM, 4 pages.
Choi et al., Current Flow Mechanism in Schottky-Barrier MOSFET and Application to the 1T-DRAM, 2008, International Conference on SSDM, pp. 226-227.
Choi, High Speed Flash Memory and 1T-DRAM on Dopant Segregated Schottky Barrier (DSSB) FinFET SONOS Device for Multifunctional SoC Applications, Dec. 2008, IEDM, pp. 223-226.
Clarke, Junctionless Transistors Could Simply Chip Making, Say Researchers, EE Times, Feb. 2010, www.eetimes.com/showArticle.jhtml?articleID=223100050, 3 pages.
Colinge, J.P., "An SOI voltage-controlled bipolar-MOS device", IEEE Transactions on Electron Devices, vol. ED-34, No. 4, Apr. 1987, pp. 845-849.
Colinge, Nanowire Transistors Without Junctions, Nature NanoTechnology, vol. 5, 2010, pp. 225-229.
Collaert et al., Optimizing the Readout Bias for the Capacitorless 1T Bulk FinFET RAM Cell, IEEE EDL, vol. 30, No. 12, pp. 1377-1379, Dec. 2009.
Collaert, Comparison of scaled floating body RAM architectures, Oct. 2008, SOI Conference, 2 pages.
Ershov, Optimization of Substrate Doping for Back-Gate Control in SOI T-RAM Memory Technology, 2005, SOI Conference, pp. 1-2.
Ertosun et al., A Highly Scalable Capacitorless Double Gate Quantum Well Single Transistor DRAM: 1T-QW DRAM, 2008, IEEE EDL, pp. 1-3.
Fazan et al., "A Simple 1-Transistor Capacitor-Less Memory Cell for High Performance Embedded DRAMs", IEEE 2002 Custom Integrated Circuits Conference, Jun. 2002, pp. 99-102.
Fazan, A Highly Manufacturable Capacitor-less 1T-DRAM Concept, 2002, SPIE, 14 pages.
Fazan, et al., "Capacitor-Less 1-Transistor DRAM", 2002 IEEE International SOI Conference, Oct. 2002, pp. 10-13.
Fazan, P., "MOSFET Design Simplifies DRAM", EE Times, May 14, 2002 (3 pages).
Fisch, et al., Soft Error Performance of Z-RAM Floating Body Memory, 2006, SOI Conference, Lausanne, Switzerland, 2 pages.
Fisch, et al., Customizing SOI Floating Body Memory Architecture for System Performance and Lower Cost, 2006, SAME Forum, Lausanne, Switzerland, 3 pages.
Fisch, Z-RAM® Ultra-Dense Memory for 90nm and Below, 2006, Hot Chips, 35 pages.
Fossum et al., New Insights on Capacitorless Floating Body DRAM Cells, IEEE EDL, vol. 28, No. 6, pp. 513-516, Jun. 2007.
Fujita, Array Architecture of Floating Body Cell (FBC) with Quasi-Shielded Open Bit Line Scheme for sub-40nm Node, 2008, SOI Conference, 2 pages.
Furuhashi, et al., Scaling Scenario of Floating Body Cell (FBC) Suppressing $V_{th}$ Variation Due to Random Dopant Fluctuation, Dec. 2008, SOI Conference, 2 pages.
Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.
Giffard et al., "Dynamic Effects in SOI MOSFET's", IEEE, 1991, pp. 160-161.
Gupta et al., SPICE Modeling of Self Sustained Operation (SSO) to Program Sub-90nm Floating Body Cells, Oct. 2009, Conf on Simulation of Semiconductor Processes & Devices, 4 pages.
Han et al., Bulk FinFET Unified-RAM (URAM) Cell for Multifunctioning NVM and Capacitorless 1T-DRAM, IEEE EDL, vol. 29, No. 6, pp. 632-634, Jun. 2008.
Han et al., Partially Depleted SONOS FinFET for Unified RAM (URAM) Unified Function for High-Speed 1T DRAM and Nonvolatile Memory, IEEE EDL, vol. 29, No. 7, pp. 781-783, Jul. 2008.
Han, Energy Band Engineered Unified-RAM (URAM) for Multi-Functioning 1T-DRAM and NVM, Dec. 2008, IEDM, pp. 227-230.
Han, Parasitic BJT Read Method for High-Performance Capacitorless 1T-DRAM Mode in Unified RAM, IEEE EDL, vol. 30, No. 10, pp. 1108-1110, Oct. 2009.
Hara, Y., "Toshiba's DRAM Cell Piggybacks on SOI Wafer", EE Times, Jun. 2003, 1 page.
Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.
Idei et al., "Soft-Error Characteristics in Bipolar Memory Cells with Small Critical Charge", IEEE Transactions on Electron Devices, vol. 38, No. 11, Nov. 1991, pp. 2465-2471.
Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.
Inoh et al., "FBC (Floating Body Cell) for Embedded DRAM on SOI", 2003 Symposium on VLSI Circuits Digest of Technical Papers, Jun. 2003 (2 pages).
Iyer et al., "SOI MOSFET on Low Cost SPIMOX Substrate", IEEE IEDM, Sep. 1998, pp. 1001-1004.
Jang et al., Highly scalable Z-RAM with remarkably long data retention for DRAM application, Jun. 2009, VLSI, 21 pages.
Jeong et al., "A Capacitor-less 1T DRAM Cell Based on a Surrounding Gate MOSFET with a Vertical Channel", Technology Development Team, Technology Development Team, Samsung Electronics Co., Ltd., pp. 92-93, May 2007.
Jeong et al., "A New Capacitorless 1T DRAM Cell: Surrounding Gate MOSFET with Vertical Channel (SGVC Cell)", IEEE Transactions on Nanotechnology, vol. 6, No. 3, May 2007, pp. 352-357.
Jeong et al., "Capacitorless DRAM Cell with Highly Scalable Surrounding Gate Structure", Extended Abstracts of the 2006 International Conference on Solid State Devices and Materials, pp. 574-575, Yokohama (2006).
Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).
Kedzierski, J.; "Design Analysis of Thin-Body Silicide Source/Drain Devices", 2001 IEEE International SOI Conference, Oct. 2001, pp. 21-22.
Kim et al., "Chip Level Reliability on SOI Embedded Memory", Proceedings 1998 IEEE International SOI Conference, Oct. 1998, pp. 135-136.
Kuo et al., "A Capacitorless Double-Gate DRAM Cell Design for High Density Applications", IEEE IEDM, Feb. 2002, pp. 843-846.
Kuo et al., "A Capacitorless Double-Gate DRAM Cell", IEEE Electron Device Letters, vol. 23, No. 6, Jun. 2002, pp. 345-347.
Kuo et al., A Capacitorless Double Gate DRAM Technology for Sub-100-nm Embedded and Stand-Alone Memory Applications, IEEE Trans. Elec.. Dev., vol. 50, No. 12, pp. 2408-2416, Dec. 2003.
Kwon et al., "A Highly Scalable $4F^2$ DRAM Cell Utilizing a Doubly Gated Vertical Channel", Extended Abstracts of the 2009 International Conference on Solid State Devices and Materials, UC Berkley, p. 142-143, Sendai (2009).
Lee et al., "A Novel Pattern Transfer Process for Bonded SOI Gigabit DRAMs", Proceedings 1996 IEEE International SOI Conference, Oct. 1996, pp. 114-115.
Leiss et al., dRAM Design Using the Taper-Isolated Dynamic RAM Cell, IEEE Transactions on Electron Devices, vol. ED-29, No. 4, Apr. 1982, pp. 707-714.
Lin et al., "Opposite Side Floating Gate SOI FLASH Memory Cell", IEEE, Mar. 2000, pp. 12-15.
Liu et al., Surface Generation-Recombination Processes of Gate and STI Oxide Interfaces Responsible for Junction Leakage on SOI, Sep. 2009, ECS Transactions, vol. 25, 10 pages.
Liu, Surface Recombination-Generation Processes of Gate, STI and Buried Oxide Interfaces, Responsible for Junction Leakage on SOI, ICSI, May 19, 2009, 2 pages.
Loncar et al., "One of Application of SOI Memory Cell—Memory Array", IEEE Proc. 22nd International Conference on Microelectronics (MIEL 2000), vol. 2, Niš, Serbia, May 14-17, 2000, pp. 455-458.

(56) References Cited

OTHER PUBLICATIONS

Lu et al., A Novel Two-Transistor Floating Body/Gate Cell for Low Power Nanoscale Embedded DRAM, Jun. 2008, IEEE Trans. Elec. Dev., vol. 55, No. 6, pp. 1511-1518.
Ma, et al., "Hot-Carrier Effects in Thin-Film Fully Depleted SOI MOSFET's", IEEE Electron Device Letters, vol. 15, No. 6, Jun. 1994, pp. 218-220.
Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.
Malinge, An 8Mbit DRAM Design Using a 1TBulk Cell, 2005 Symposium on VLSI Circuits Digest of Technical Papers, pp. 358-361.
Mandelman et al, "Floating-Body Concerns for SOI Dynamic Random Access Memory (DRAM)", Proceedings 1996 IEEE International SOI Conference, Oct. 1996, pp. 136-137.
Matsuoka et al., FBC Potential of $6F^2$ Single Cell Operation in Multi Gbit Memories Confirmed by a Newly Developed Method for Measuring Signal Sense Margin, 2007, IEEE, pp. 39-42.
Minami, A Floating Body Cell (FBC) fully Compatible with 90nm CMOS Technology(CMOS IV) for 128Mb SOI DRAM, 2005, IEDM Tech. Digest, pp. 317-320 (4 pages).
Mohapatra et al., Effect of Source/Drain Asymmetry on the Performance of Z-RAM® Devices, Oct. 2009, SOI conference, 2 pages.
Morishita, A Capacitorless Twin-Transistor Random Access Memory (TTRAM) on SOI, 2005, CICC, 4 pages.
Morishita, F. et al., "A Configurable Enhanced TTRAM Macro for System-Level Power Management Unified Memory", IEEE Journal of Solid-State Circuits, vol. 42, No. 4, pp. 853-861, Apr. 2007.
Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.
Morishita, F., et al., "Dynamic Floating Body Control SOI CMOS Circuits for Power Managed Multimedia ULSIs", Proc. CICC, pp. 263-266, 1997.
Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.
Nagoga, Studying of Hot Carrier Effect in Floating Body Soi Mosfets by the Transient Charge Pumping Technique, Switzerland 2003, 2 pages.
Nayfeh, A Leakage Current Model for SOI based Floating Body Memory that Includes the Poole-Frenkel Effect, 2008, SOI Conference, 2 pages.
Nemati, A Novel High Density, Low Voltage SRAM Cell with a Vertical NDR Device, 1998, VLSI Tech. Symp., 2 pages.
Nemati, A Novel Thyristor-based SRAM Cell (T-RAM) for High-Speed, Low-Voltage, Giga-scale Memories, 1999, IEDM Conference, 4 pages.
Nemati, Embedded Volatile Memories-Embedded Tutorial: The New Memory Revolution, New Drives Circuits and Systems, ICCAD 2008, Nov. 2008, San Jose, CA, 23 pages.
Nemati, Fully Planar 0.562 $\mu m^2$ T-RAM Cell in a 130nm SOI CMOS Logic Technology for High-Density High-Performance SRAMs, 2004, IEDM, 4 pages.
Nemati, Thyristor RAM (T-RAM): A High-Speed High-Density Embedded Memory Technology for Nano-scale CMOS, 2007, Hot Chips Conference, Milpitas, CA, 24 pages.
Nemati, Thyristor-RAM: A Novel Embedded Memory Technology that Outperforms Embedded S RAM/DRAM, 2008, Linley Tech Tour, San Jose, CA, 11 pages.
Nishiguchi et al., Long Retention of Gain-Cell Dynamic Random Access Memory with Undoped Memory Node, IEEE EDL, vol. 28, No. 1, pp. 48-50, Jan. 2007.
Oh, Floating Body DRAM Characteristics of Silicon-On-ONO (SOONO) Devices for System-on-Chip (SoC) Applications, 2007, Symposium on VLSI Technology Digest of Technical Papers, pp. 168-169.
Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.
Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).
Ohsawa et al., "Memory Design Using a One-Transistor Gain Cell on SOI", IEEE Journal of Solid-State Circuits, vol. 37, No. 11, Nov. 2002, pp. 1510-1522.
Ohsawa, A 128Mb Floating Body RAM (FBRAM) on SOI with a Multi-Averaging Scheme of Dummy Cell, 2006 Symposium of VLSI Circuits Digest of Tech Papers, (2006), 2 pages.
Ohsawa, et al., An 18.5ns 128Mb SOI DRAM with a Floating Body Cell, 2005, ISSCC, pp. 458-459 & 609 (3 pages).
Ohsawa, Autonomous Refresh of Floating Body Cell (FBC), Dec. 2008, IEDM, pp. 801-804.
Ohsawa, Design of a 128-Mb SOI DRAM Using the Floating Body Cell (FBC), IEEE J. Solid-State Circuits, vol. 41, No. 1, Jan. 2006, pp. 135-145.
Okhonin, A Capacitor-Less 1T-DRAM Cell, IEEE Electron Device Letters, vol. 23, No. 2, Feb. 2002, pp. 85-87.
Okhonin, A SOI Capacitor-less 1T-DRAM Concept, pp. 153-154, 2001, SOI Conference.
Okhonin, et al., Charge Pumping Effects in Partially Depleted SOI MOSFETs, 2003, SOI Conference, 2 pages.
Okhonin, et al., New characterization techniques for SOI and related devices, 2003, ECCTD, 1 page.
Okhonin, et al., New Generation of Z-RAM, 2007, IEDM, Lausanne, Switzerland, 3 pages.
Okhonin, Principles of Transient Charge Pumping on Partially Depleted SOI MOSFETs, May 2002, IEEE Electron Device Letters, vol. 23, No. 5, pp. 279-281.
Okhonin, et al., Transient Charge Pumping for Partially and Fully Depleted SOI MOSFETs, 2002, SOI Conference, 2 pages.
Okhonin, Transient effects in PD SOI MOSFETs and potential DRAM applications, 2002, Solid-State Electronics, vol. 46, pp. 1709-1713.
Okhonin, et al., Ultra-scaled Z-RAM cell, 2008, SOI Conference, 2 pages.
Okhonin, Z-RAM® (Limits of DRAM), 2009, ESSDERC, Lausanne, Switzerland, 64 pages.
Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008, pp. 171-174.
Park, Fully Depleted Double-Gate 1T-DRAM Cell with NVM Function for High Performance and High Density Embedded DRAM, 2009, IMW, pp. 32-33.
Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.
Portmann et al., "A SOI Current Memory for Analog Signal Processing at High Temperature", 1999 IEEE International SOI Conference, Oct. 1999, pp. 18-19.
Puget et al., 1T Bulk eDRAM using Gate-Induced Drain-Leakage (GIDL) Current for High Speed and Low Power applications, 2008, pp. 224-225, SSDM.
Puget et al., Quantum effects influence on thin silicon film capacitor-less DRAM performance, 2006, SOI Conference, 2 pages.
Puget, FDSOI Floating Body Cell eDRAM Using Gate-Induced Drain-Leakage (GIDL) Write Current for High Speed and Low Power Applications, 2009, IMW, pp. 28-29.
Ranica et al., 1T-Bulk DRAM cell with improved performances: the way to scaling, 2005, ICMTD, 4 pages.
Ranica, et al., A capacitor-less DRAM cell on 75nm gate length, 16nm thin Fully Depleted SOI device for high density embedded memories, 2004, IEDM, 4 pages.
Ranica, A One Transistor Cell on Bulk Substrate (1T-Bulk) for Low-Cost and High Density eDRAM, 2004, Symposium on VLSI Technology Digest of Technical Papers, pp. 128-129 (2 pages).
Rodder et al., "Silicon-On-Insulator Bipolar Transistors", IEEE Electron Device Letters, vol. EDL-4, No. 6, Jun. 1983, pp. 193-195.

(56) References Cited

OTHER PUBLICATIONS

Rodriguez, Noel, et al., A-RAM Novel Capacitor-less DRAM Memory, SOI Conference, 2009 IEEE International, Oct. 5-8, 2009 pp. 1-2.
Roy, et al., Thyristor-Based Volatile Memory in Nano-Scale CMOS, 2006, ISSCC, 10 pages.
Salling et al., Reliability of Thyristor Based Memory Cells, 2009, IRPS, 7 pages.
Sasaki et al., Charge Pumping in SOS-MOS Transistors, IEEE Trans. Elec. Dev., vol. ED-28, No. 1, Jan. 1981, pp. 48-52.
Sasaki et al., Charge Pumping SOS-MOS Transistor Memory, 1978, IEDM, pp. 356-359 (4 pages and clear graph of Fig. 10).
Schloesser et al., "A $6F^2$ Buried Wordline DRAM Cell for 40nm and Beyond", IEEE, Qimonda Dresden GmbH & Co., pp. 809-812 (2008).
Shino et al., Floating Body RAM Technology and its Scalability to 32nm Node and Beyond, 2006, IEDM, 4 pages.
Shino et al., Operation Voltage Dependence of Memory Cell Characteristics in Fully Depleted Floating Body Cell, IEEE Trans. Elec. Dev., vol. 25, No. 10, Oct. 2005, pp. 2220-2226.
Shino, et al., Fully-Depleted FBC (Floating Body Cell) with Enlarged Signal Window and Excellent Logic Process Compatibility, 2004, IEDM, 4 pages.
Shino, et al. Highly Scalable FBC (Floating Body Cell) with 25nm BOX Structure for Embedded DRAM Applications, 2004, Symposium on VLSI Technology, pp. 132-133 (2 pages).
Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.
Singh, et al., A 2ns-Read-Latency 4Mb Embedded Floating-Body Memory Macro in 45nm SOI Technology, Feb. 2009, ISSCC, 3 pages.
Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.
Song, et al., 55 nm Capacitor-less 1T DRAM Cell Transistor with Non-Overlap Structure, Dec. 2008, IEDM, pp. 797-800.
Stanojevic et al., "Design of a SOI Memory Cell", IEEE Proc. 21st International Conference on Microelectronics (MIEL '97), vol. 1, Nis, Yugoslavia, Sep. 14-17, 1997, pp. 297-300.
Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).
Suma et al., "An SOI-DRAM with Wide Operating Voltage Range by CMOS/SIMOX Technology", 1994 IEEE International Solid-State Circuits Conference, pp. 138-139.
Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.
Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.
Tack et al., "The Multistable Charge-Controlled Memory Effect in SOI MOS Transistors at Low Temperatures", IEEE Transactions on Electron Devices, vol. 37, No. 5, May 1990, pp. 1373-1382.
Tack, et al., "An Analytical Model for the Misis Structure in SOI MOS Devices", Solid-State Electronics vol. 33, No. 3, 1990, pp. 357-364.
Tanabe et al., A 30-ns 64-MB DRAM with Built-in-Self-Test and Self-Repair Function, IEEE Journal of Solid State Circuits, vol. 27, No. 11, Nov. 1992, pp. 1525-1533.
Tanaka et al., "Scalability Study on a Capacitorless 1T-DRAM: From Single-gate PD-SOI to Double-gate FINDRAM", 2004 IEEE, 4 pages.
Tang, et al., Highly Scalable Capacitorless DRAM Cell on Thin-Body with Band-gap Engineered Source and Drain, Extended Abstracts of the 2009 ICSSDM, Sendai, 2009, pp. 144-145.
Terauchi et al., "Analysis of Floating-Body-Induced Leakage Current in 0.15 μm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.
Tomishima, et al., "A Long Data Retention SOI DRAM with the Body Refresh Function", IEICE Trans. Electron., vol. E80-C, No. 7, Jul. 1997, pp. 899-904.
Tsaur et al., "Fully Isolated Lateral Bipolar-MOS Transistors Fabricated in Zone-Melting-Recrystallized Si Films on $SiO_2$,", IEEE Electron Device Letters, vol. EDL-4, No. 8, Aug. 1983, pp. 269-271.
Tu, et al., "Simulation of Floating Body Effect in SOI Circuits Using BSIM3SOI", Proceedings of Technical Papers (IEEE Cat No. 97TH8303), Jun. 1997, pp. 339-342.
Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (2 pages).
Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).
Villaret et al., Further Insight into the Physics and Modeling of Floating Body Capacitorless DRAMs, IEEE Trans. Elec. Dev., vol. 52, No. 11, Nov. 2005, pp. 2447-2454.
Wang et al., A Novel $4.5F^2$ Capacitorless Semiconductor Memory Device, 2008, IEEE EDL, pp. 1-2.
Wann et al., "A Capacitorless DRAM Cell on SOI Substrate", IEEE IEDM, 1993, pp. 635-638.
Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.
Wei, A., "Measurement of Transient Effects in SOI DRAM/SRAM Access Transistors", IEEE Electron Device Letters, vol. 17, No. 5, May 1996, pp. 193-195.
Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.
Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.
Yamanaka et al., "Advanced TFT SRAM Cell Technology Using a Phase-Shift Lithography", IEEE Transactions on Electron Devices, vol. 42, No. 7, Jul. 1995, pp. 1305-1313.
Yamauchi et al., "High-Performance Embedded SOI DRAM Architecture for the Low-Power Supply", IEEE Journal of Solid-State Circuits, vol. 35, No. 8, Aug. 2000, pp. 1169-1178.
Yamawaki, M., "Embedded DRAM Process Technology", Proceedings of the Symposium on Semiconductors and Integrated Circuits Technology, 1998, vol. 55, pp. 38-43.
Yang, et al., Optimization of Nanoscale Thyristors on SOI for High-Performance High-Density Memories, 2006, SOI Conference, 2 pages.
Yoshida et al., "A Design of a Capacitorless 1-T-DRAM Cell Using Gate-induced Drain Leakage (GIDL) Current for Low-Power and High-speed Embedded Memory", 2003 IEEE, 4 pages.
Yoshida et al., "A Study of High Scalable DG-FinDRAM", IEEE Electron Device Letters, vol. 26, No. 9, Sep. 2005, pp. 655-657.
Yoshida et al., A Capacitorless 1T DRAM Technology Using Gate-Induced Drain-Leakage (GIDL) Current for Low Power and High Speed Embedded Memory, IEEE Trans. Elec. Dev., vol. 53, No. 4, Apr. 2006, pp. 692-697.
Yu et al., Hot-Carrier Effect in Ultra-Thin-Film (UTF) Fully-Depleted SOI MOSFETs, 54th Annual Device Research Conference Digest (Cat. No. 96TH8193), Jun. 1996, pp. 22-23.
Yu et al., "Hot-Carrier-Induced Degradation in Ultra-Thin-Film Fully-Depleted SOI MOSFETs", Solid-State Electronics, vol. 39, No. 12, 1996, pp. 1791-1794.
Yu et al., "Interface Characterization of Fully-Depleted SOI MOSFET by a Subthreshold I-V Method", Proceedings 1994 IEEE International SOI Conference, Oct. 1994, pp. 63-64.
Yun et al., Analysis of Sensing Margin in Silicon-On-ONO (SOONO) Device for the Capacitor-less RAM Applications, 2007, SOI Conference, 2 pages.
Zhou, Physical Insights on BJT-Based 1T DRAM Cells, IEEE Electron Device Letters, vol. 30, No. 5, May 2009, pp. 565-567.

\* cited by examiner

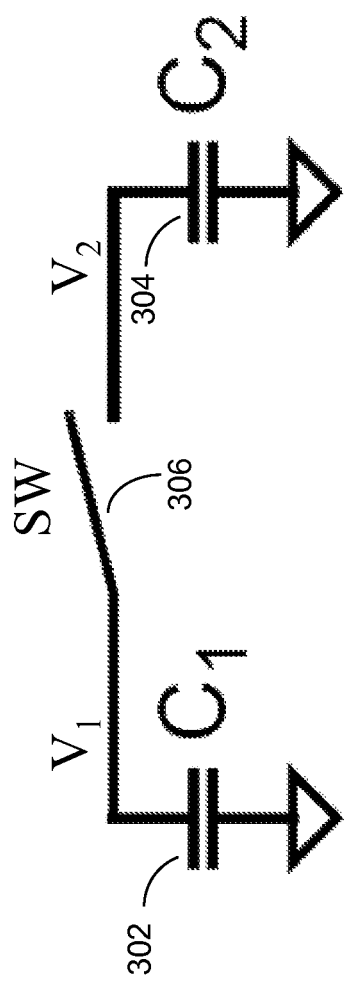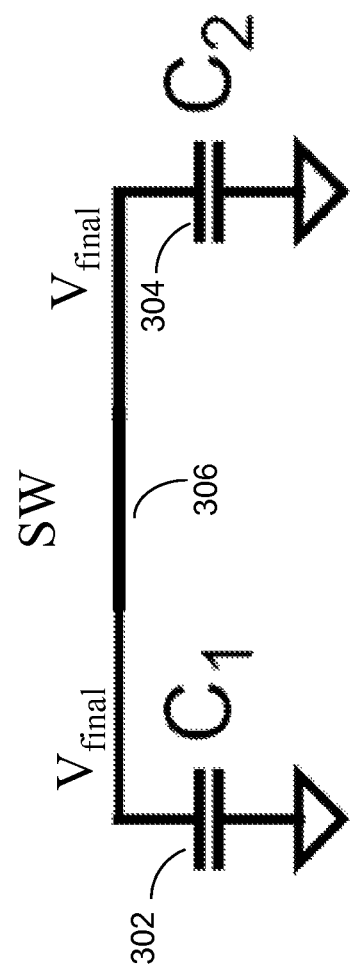
FIG. 3-A
FIG. 3-B

TECHNIQUES FOR ACCESSING MEMORY CELLS

CROSS-REFERENCE TO RELATED APPLICATIONS

This patent application is a continuation of U.S. patent application Ser. No. 13/422,870, filed Mar. 16, 2012, which is related to U.S. patent application Ser. No. 12/019,320, filed on Jan. 24, 2008, now U.S. Pat. No. 8,264,041, issued Sep. 11, 2012, each of which is hereby incorporated by reference herein in its entirety.

FIELD OF THE DISCLOSURE

The present disclosure relates generally to memory devices and, more particularly, to techniques for accessing memory cells.

BACKGROUND OF THE DISCLOSURE

As the performance of microprocessors improves, there is a growing demand for better performance, higher density memory. Memory manufacturers have addressed this challenge in at least two ways: by developing new types of memory, such as zero-capacitor random access memory (Z-RAM), and by improving the signaling for accessing memory, such as using boosted voltages for accessing SRAM cells. Although these developments helped satisfy the demand for better memory, these developments increased the complexity of memory devices and led to the use of multiple voltage levels in memory devices.

Unfortunately, using multiple voltage levels in memory devices can be expensive in terms of manufacturing cost and power consumption. To use multiple voltage levels, memory devices can either generate the multiple voltage levels on-chip or receive multiple voltage levels from off-chip voltage sources. However, generating multiple voltages on-chip can entail using a charge pump or a tank capacitor, which can consume a large amount of power and die-area. Receiving voltages from off-chip voltage sources can entail dedicating multiple pins for receiving voltages, which can increase the packaging and manufacturing cost.

In view of the foregoing, it may be understood that there may be significant problems and shortcomings associated with current memory technologies.

INCORPORATION BY REFERENCE

Each patent, patent application, and/or publication mentioned in this specification is herein incorporated by reference in its entirety to the same extent as if each individual patent, patent application, and/or publication was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be illustrative only.

FIGS. 3A and 3B illustrate a charge sharing technique in accordance with an embodiment of the present disclosure.

DETAILED DESCRIPTION OF EMBODIMENTS

Figure 1:
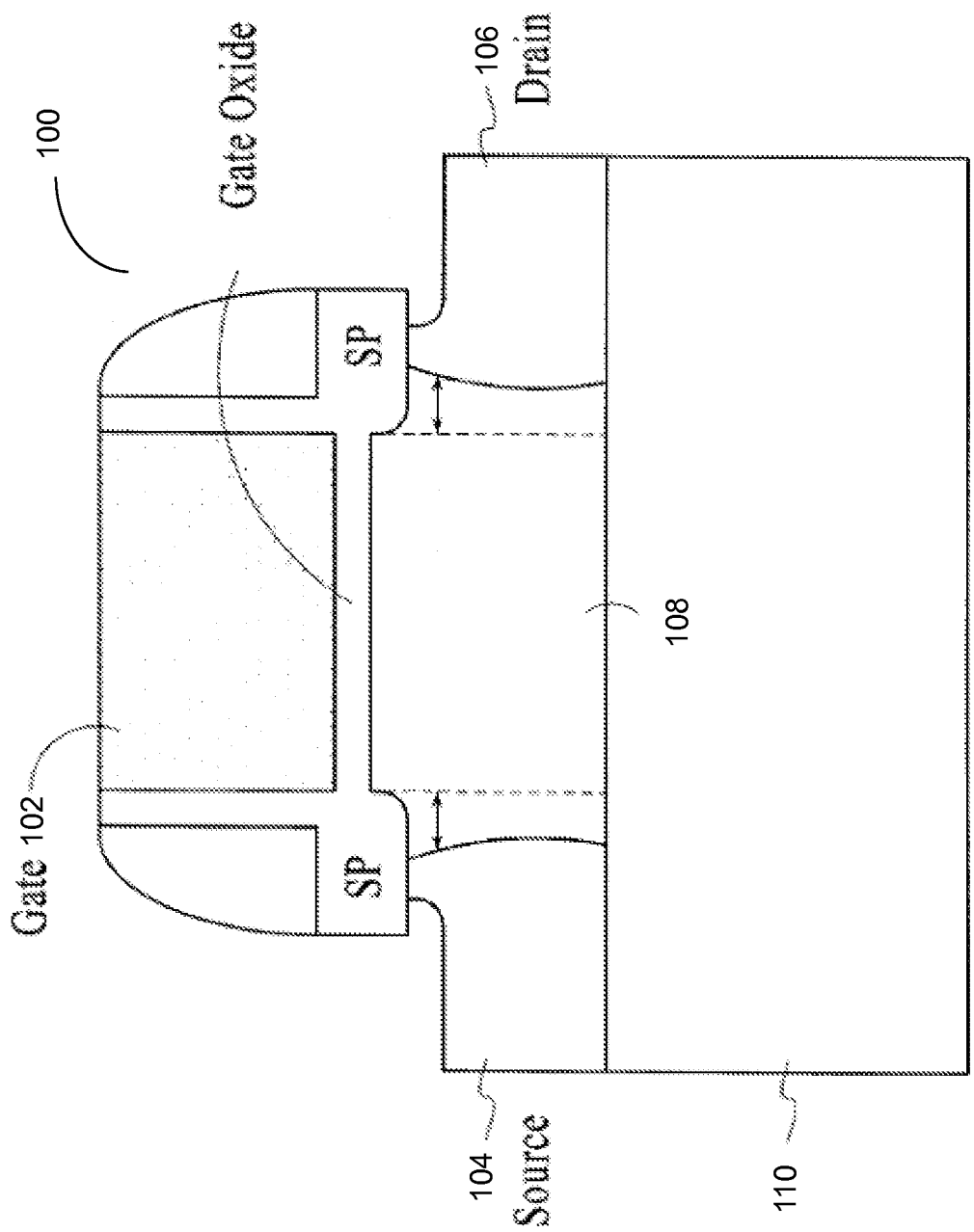
FIG. 1 shows a Z-RAM memory cell in accordance with an embodiment of the present disclosure.

Techniques for accessing memory cells are disclosed. In one particular embodiment, the techniques may be realized as an apparatus providing voltage to a high impedance node of a memory cell. The apparatus may comprise a precharge switch coupled to a first voltage source node, a precharge capacitor coupled to the precharge switch, and a switch matrix coupled to the precharge capacitor, a second voltage source node, and the high impedance node of the memory cell. The precharge switch may be configured to decouple the precharge capacitor from the first voltage source node, and the switch matrix may be configured to decouple the second voltage source node from the high impedance node of the memory cell and to couple the precharge capacitor to the high impedance node of the memory cell.

In accordance with other aspects of this particular embodiment, the memory cell in the apparatus may comprise a zero-capacitor random access memory (Z-RAM) cell, and the high impedance node of the memory cell may comprise a gate node of the Z-RAM cell.

In accordance with further aspects of this particular embodiment, the first voltage source node may be configured to provide a write voltage of the memory cell and the second voltage source node may be configured to provide a hold voltage of the memory cell.

In accordance with additional aspects of this particular embodiment, the precharge capacitor may comprise a parasitic capacitor of a conductive line between the precharge switch and the switch matrix.

In accordance with additional aspects of this particular embodiment, the apparatus may further comprise an access controller configured to control the precharge switch and the switch matrix to provide selected voltage levels to the high impedance node.

In accordance with further aspects of this particular embodiment, in a first mode of operation the access controller may be configured to trigger the precharge switch to couple the first voltage source node to the precharge capacitor and to trigger the switch matrix to couple the second voltage source node to the high impedance node, and in a second mode of operation the access controller may be configured to trigger the precharge switch to decouple the first voltage source node from the precharge capacitor and to trigger the switch matrix to couple the precharge capacitor to the high impedance node.

In accordance with further aspects of this particular embodiment, in a first mode of operation the access controller may be configured to trigger the precharge switch and the switch matrix to couple the first voltage source node to the precharge capacitor and the high impedance node, in a second mode of operation, the access controller may be configured to trigger the precharge switch to decouple the first voltage source node to the precharge capacitor, to trigger the switch matrix to decouple the high impedance node from the precharge capacitor, and to trigger the switch matrix to couple the high impedance node to the second voltage source node, and in a third mode of operation the access controller may be configured to trigger the switch matrix to decouple the high impedance node from the second voltage source and to couple the precharge capacitor to the high impedance node.

In accordance with additional aspects of this particular embodiment, the switch matrix may comprise a first switch and a second switch, and the first switch and the second switch may be connected in series. One node of the first switch may be coupled to the precharge capacitor, one node of the second switch may be coupled to the second voltage source node, and a common node of the first switch and the second switch may be coupled to the high impedance node of the memory cell.

In accordance with further aspects of this particular embodiment, the precharge switch may comprise a tri-state logic gate.

In accordance with further aspects of this particular embodiment, the precharge switch may comprise a transmission gate.

In accordance with further aspects of this particular embodiment, the precharge capacitor may comprise a wordline bus, the precharge switch may comprise a first demultiplexer coupled to the wordline bus, and the switch matrix may comprise a second multiplexer configured to couple the wordline bus to the high impedance node.

In another particular embodiment, the techniques may be realized as a memory apparatus. The memory apparatus may comprise a memory cell array having a plurality of memory cells, a wordline coupled to a high impedance node of one or more of the plurality of memory cells in the memory cell array, a precharge switch coupled to a first voltage source node, a precharge capacitor coupled to the precharge switch, and a switch matrix coupled to the precharge capacitor, a second voltage source node, and the high impedance node of the memory cell. The precharge switch may be configured to decouple the precharge capacitor from the first voltage source node, and the switch matrix may be configured to decouple the second voltage source node from the high impedance node of the memory cell and to couple the precharge capacitor to the high impedance node of the memory cell.

In accordance with aspects of this particular embodiment, the precharge capacitor may comprise a parasitic capacitor of a conductive line between the precharge switch and the switch matrix.

In accordance with aspects of this particular embodiment, the precharge capacitor may comprise a capacitor formed by a dummy wordline coupled to one or more memory cells in the memory cell array.

In accordance with aspects of this particular embodiment, the precharge switch may comprise a tri-state logic gate.

In accordance with further aspects of this particular embodiment, the switch matrix may comprise a first switch and a second switch, and the first switch and the second switch may be connected in series. One node of the first switch may be coupled to the precharge capacitor, one node of the second switch may be coupled to the second voltage source node, and a common node of the first switch and the second switch may be coupled to the high impedance node of the memory cell.

In accordance with additional aspects of this particular embodiment, the first switch and the second switch may each comprise a respective transmission gate.

In accordance with aspects of this particular embodiment, the memory apparatus may comprise an access controller configured to control the precharge switch and the switch matrix to provide selected voltage levels to the high impedance node.

In accordance with further aspects of this particular embodiment, in a first mode of operation the access controller may trigger the precharge switch to couple the first voltage source node to the precharge capacitor and trigger the switch matrix to couple the second voltage source node to the high impedance node, and in a second mode of operation the access controller may trigger the precharge switch to decouple the first voltage source node from the precharge capacitor and trigger the switch matrix to couple the precharge capacitor to the high impedance node.

In accordance with additional aspects of this particular embodiment, in a first mode of operation the access controller may be configured to trigger the precharge switch and the switch matrix to couple the first voltage source node to the precharge capacitor and the high impedance node, in a second mode of operation the access controller may be configured to trigger the precharge switch to decouple the first voltage source node to the precharge capacitor, to trigger the switch matrix to decouple the high impedance node from the precharge capacitor, and to trigger the switch matrix to couple the high impedance node to the second voltage source node, and in a third mode of operation the access controller may be configured to trigger the switch matrix to decouple the high impedance node from the second voltage source and to couple the precharge capacitor to the high impedance node.

In accordance with aspects of this particular embodiment, the precharge capacitor may comprise a wordline bus, the precharge switch may comprise a first demultiplexer coupled to the wordline bus, and the switch matrix may comprise a second multiplexer configured to couple the wordline bus to the high impedance node.

In another particular embodiment, the techniques may be realized as logic encoded on one or more non-transitory media for execution and when executed operable to provide a desired voltage to a high impedance node of a memory cell. The logic may be operable to trigger a precharge switch to couple a precharge capacitor to a first voltage source to charge the precharge capacitor to a first voltage, trigger a switch matrix to couple the high impedance node of the memory cell to a second voltage source to charge the high impedance node of the memory cell to a second voltage, and trigger the precharge switch to decouple the precharge capacitor from the first voltage source. The logic may further trigger the switch matrix to decouple the high impedance node of the memory cell from the second voltage source, and trigger the switch matrix to couple the precharge capacitor to the high impedance node of the memory cell, thereby providing a voltage to the high impedance node of the memory cell.

In accordance with aspects of this particular embodiment, the precharge capacitor may comprise a capacitor bank that may be configured to provide a selected capacitance.

In accordance with further aspects of this particular embodiment, the logic may be further operable to configure the capacitor bank to provide the desired voltage to the high impedance node of the memory cell.

In accordance with additional aspects of this particular embodiment, the precharge switch may comprise a tri-state logic gate.

In accordance with aspects of this particular embodiment, the precharge capacitor may comprise a wordline bus, the precharge switch may comprise a first demultiplexer coupled to the wordline bus, and the switch matrix may comprise a second multiplexer configured to couple the wordline bus to the high impedance node.

The present disclosure will now be described in more detail with reference to particular embodiments thereof as shown in the accompanying drawings. While the present disclosure is described below with reference to particular embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

Disclosed apparatuses and methods illustrate efficient mechanisms for providing (e.g., applying, delivering, generating etc.) multiple voltage levels to memory cells. The disclosed mechanisms can use a charge sharing technique for providing arbitrary voltages to a high impedance node of a memory cell.

As illustrated in FIG. 1, one of the memory cells with a high impedance node is a zero-capacitor random access memory (Z-RAM) memory cell. A Z-RAM memory cell has a single transistor 100 with a gate 102, a source, 104, a drain 106, and an electrically floating body 108, and a Z-RAM transistor 100 can be built on a Silicon-on-Insulator (SOI) wafer 110. A notable characteristic of the Z-RAM transistor 100 is that it stores its data state in the floating body 108. Further details of the Z-RAM technology can be found in the apparatuses and methods disclosed in U.S. patent application Ser. No. 12/019,320, by Okhonin, filed on Jan. 24, 2008, entitled "Semiconductor Device With Electrically Floating Body," which is hereby incorporated by reference in its entirety.

Figure 2:
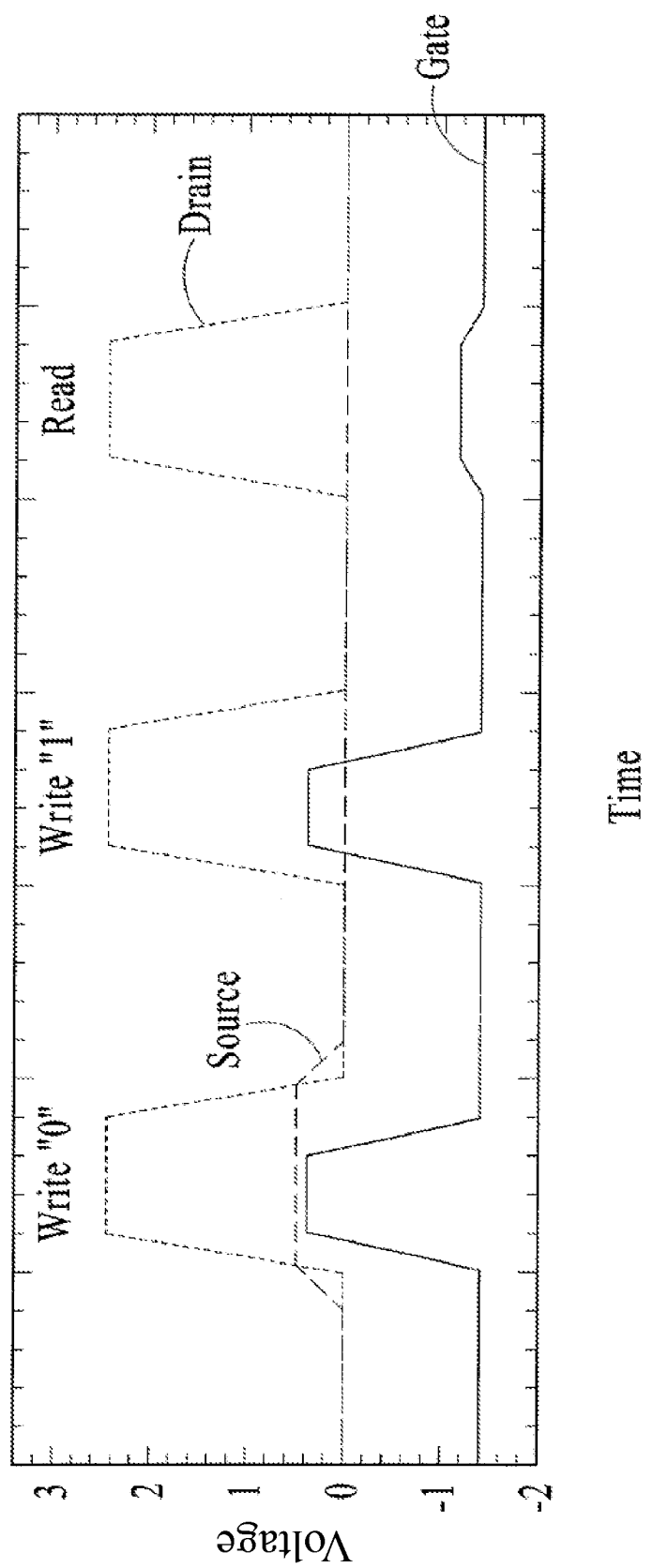
FIG. 2 shows how an access controller accesses and programs a Z-RAM memory cell in accordance with an embodiment of the present disclosure.

FIG. 2 illustrates, in accordance with certain embodiments, how a Z-RAM memory device accesses and programs Z-RAM transistors 100. A Z-RAM memory device can be in one of the following modes of operation: a hold mode, a read mode, a write logical "high" mode, and a write logical "low" mode. In the hold mode, a Z-RAM memory device maintains data states stored in Z-RAM transistors 100; in the read mode, a Z-RAM memory device reads the stored data states from Z-RAM transistors 100; in a write logical "high" mode, a Z-RAM memory device writes a "high" data state to Z-RAM transistors 100; and in a write logical "low" mode, a Z-RAM memory device writes a "low" data state to Z-RAM transistors 100.

As illustrated in FIG. 2, in each of these modes, the Z-RAM memory device can provide different voltages to Z-RAM transistors to place these transistors into appropriate operating modes. For example, in the hold mode, the Z-RAM memory device can provide −1.5V, 0V, and 2.5V to the transistors' gate 102, source 104, and drain 106, respectively; in the read mode, the Z-RAM memory device can provide −1V, 0V, and 2.5V to the transistors' gate 102, source 104, and drain 106, respectively; in a write logical "high" mode, the Z-RAM memory device can provide 0.5V, 0V, and 2.5V to the transistors' gate 102, source 104, and drain 106, respectively; and in a write logical "low" mode, the Z-RAM memory device can provide 0.5V, 0.5V, and 2.5V to the transistors' gate 102, source 104, and drain 106, respectively.

FIG. 2 illustrates that the high impedance node of the Z-RAM transistor 100, i.e., the gate 102, receives one of three voltages: a hold voltage $V_{hd}$ (e.g., −1.5V), a write voltage $V_{wr}$ (e.g., 0.5V), and a read voltage $V_r$, (e.g., −0.5V). Therefore, as long as the Z-RAM memory device provides these three voltage levels, the Z-RAM memory device can provide appropriate voltages to the high impedance node of the Z-RAM transistor.

Although the precise value of the read voltage $V_r$ can vary from one embodiment of Z-RAM to another, the read voltage $V_r$ can be designed to lie between the hold voltage $V_{hd}$ and the write voltage $V_{wr}$. The disclosed embodiments illustrate that, when the hold voltage $V_{hd}$ and the write voltage $V_{wr}$ are provided through other means, the read voltage $V_r$ can be generated from the hold voltage $V_{hd}$ and the write voltage $V_{wr}$ using a charge sharing technique.

Charge sharing is a technique for generating a voltage that is a weighted average of two voltages. FIGS. 3A-3B illustrate charge sharing in accordance with certain embodiments. In FIG. 3A, capacitors $C_1$ 302 and $C_2$ 304 are individually biased at voltages $V_1$ and $V_2$, respectively, and are decoupled from any voltage sources. Furthermore, the capacitors $C_1$ 302 and $C_2$ 304 are electrically decoupled by an open switch SW 306. Therefore, the capacitor $C_1$ 302 maintains $C_1V_1$ of charge; the capacitor $C_2$ 304 maintains $C_2V_2$ of charge.

In FIG. 3B, the two capacitors $C_1$ 302 and $C_2$ 304 become electrically coupled by the closed switch SW 306. When the switch SW 306 shorts the two capacitors $C_1$ 302 and $C_2$ 304, the capacitors $C_1$ 302 and $C_2$ 304 start sharing charges that were individually maintained. This charge sharing equalizes the voltage across the capacitors $C_1$ 302 and $C_2$ 304 to $V_{final}$.

Conservation of electric charges states that the total amount of charge before closing the switch SW 306 (i.e., FIG. 3A) should be equal to the total amount of charge after closing the switch SW 306 (i.e., FIG. 3B). In other words, $(C_1+C_2)V_{final}=C_1V_1+C_2V_2$. Therefore, the voltage across the capacitors $C_1$ 302 and $C_2$ 304 after closing the switch SW 306 is:

$$V_{final} = \frac{C_1V_1 + C_2V_2}{(C_1 + C_2)}$$

Thus, the charge sharing mechanism can provide a voltage $V_{final}$ that is a weighted average of two voltages $V_1$ and $V_2$. The weights can be controlled by changing the capacitance of the capacitors $C_1$ 302 and $C_2$ 304. As long as the common node between the two capacitors $C_1$ 302 and $C_2$ 304 is not coupled to a low-impedance node, such as a charge sink, the voltage $V_{final}$ at the common node can be maintained.

Memory devices can use this charge sharing technique to provide arbitrary voltages for high impedance nodes of memory cells. As long as the memory device has access to two boundary voltage levels (i.e., $V_1$ and $V_2$ in FIGS. 3A-3B), the memory device can provide arbitrary voltage levels that are between them through charge sharing. For example, if a Z-RAM memory device has access to the write voltage $V_{wr}$ and the hold voltage $V_{hd}$, the memory device can provide the read voltage $V_r$ via charge sharing.

Figure 4:
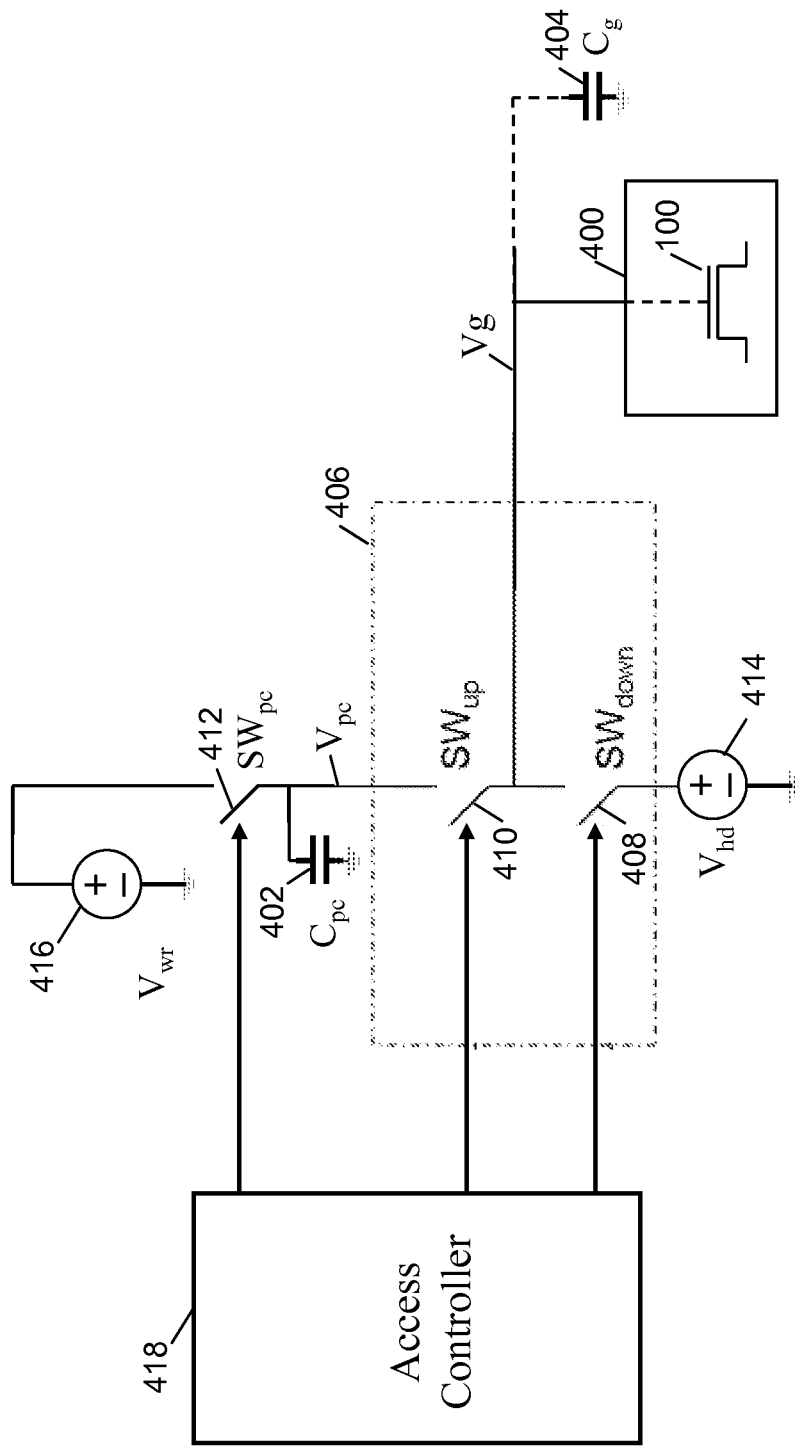
FIG. 4 shows a memory apparatus using a charge sharing technique in accordance with an embodiment of the present disclosure.

FIG. 4 shows a circuit diagram that is configured to read and program a memory cell in accordance with certain embodiments. FIG. 4 includes a memory cell 400, a precharge capacitor $C_{pc}$ 402, the high impedance node capacitance $C_g$ 404 of the memory cell 400, a switch matrix 406 that includes a down switch $SW_{dn}$ 408 and an up switch $SW_{up}$ 410, a pre-charge switch $SW_{pc}$ 412, and voltage sources 414, 416. The memory cell can include a Z-RAM memory cell 400. If the memory cell includes a Z-RAM memory cell 400, the high impedance node capacitance $C_g$ 404 of the memory cell can be the effective gate capacitance of the Z-RAM memory cell 400. The switches 408, 410, 412 can be controlled using an access controller 418, and the voltage sources 414, 416 can include a charge pump, a tank capacitor, or a voltage reference.

As discussed above, certain embodiments of a Z-RAM memory cell have four modes of operations: a hold mode, a read mode, and two writing modes. In a hold mode of the memory cell 400, the access controller 418 configures the switches to provide the hold voltage $V_{hd}$ to the high impedance node of the memory cell 400. To this end, the access controller 418 can close the down switch $SW_{dn}$ 408 and opens the up switch $SW_{up}$ 410. This triggers the hold voltage source 414 to charge the effective high impedance node capacitance $C_g$ 404 of the memory cell, bringing the gate voltage $V_g$ to the hold voltage $V_{hd}$.

When the memory device switches from the hold mode to a write mode, the access controller 418 configures the switch matrix 406 to provide the write voltage $V_{wr}$ to the gate of the memory cell 400. To this end, the access controller 418 can open the down switch $SW_{dn}$ 408, and close the up switch $SW_{up}$ 410 and the pre-charge switch $SW_{pc}$ 412. The access controller 418 can close the up switch $SW_{up}$ 410 and the pre-charge switch $SW_{pc}$ 412 substantially simultaneously. The write voltage source 416 would subsequently charge the high impedance node capacitance $C_g$ 404 of the memory cell, bringing the gate voltage $V_g$ to the write voltage $V_{wr}$.

When the memory device switches from the hold mode to a read mode, the access controller 418 configures the switch matrix 406 to provide a read voltage $V_r$ to the gate of the memory cell 400. The read voltage $V_r$ can be provided from the charge sharing of the pre-charge capacitor $C_{pc}$ 402 and the high impedance node capacitor $C_g$ 404.

As a first step, the access controller 418 closes the pre-charge switch $SW_{pc}$ 412 and opens the up switch $SW_{up}$ 410. This way, the voltage source 416 pre-charges the pre-charge capacitor $C_{pc}$ 402 to the write voltage $V_{wr}$. Once the pre-charge capacitor $C_{pc}$ 402 is pre-charged, the access controller 418 opens the pre-charge switch $SW_{pc}$ 412, thereby electrically decoupling the pre-charge capacitor $C_{pc}$ 402 from the voltage source 416.

Figure 5:
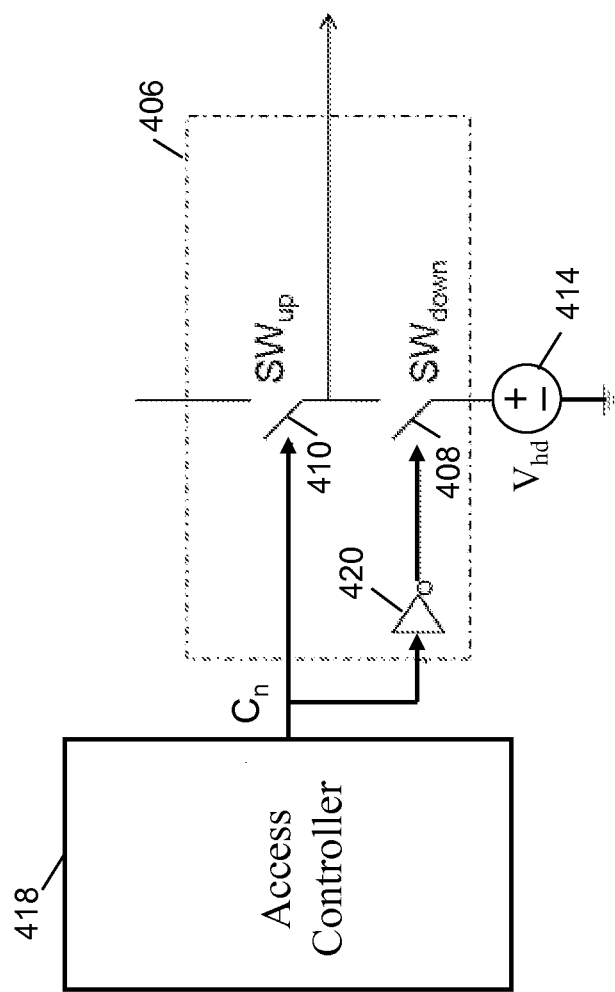
FIG. 5 illustrates how an access controller configures the electrical state of a switch matrix in accordance with an embodiment of the present disclosure.

Subsequently, the access controller 418 opens the down switch $SW_{dn}$ 408 and closes the up switch $SW_{up}$ 410 to couple the pre-charge capacitor $C_{pc}$ 402 to the high impedance node capacitor $C_g$ 404. In certain embodiments, the access controller 418 can open the down switch $SW_{dn}$ 408 and close the up switch $SW_{up}$ 410 substantially simultaneously. FIG. 5 illustrates, in accordance with certain embodiments, how the access controller 418 opens the down switch $SW_{dn}$ 408 and closes the up switch $SW_{up}$ 410 substantially simultaneously. The access controller 418 can provide a selection signal $C_n$, which is directly coupled to the up switch $SW_{up}$ 410. The selection signal $C_n$ can also be provided to an inverter 420, the output of which is subsequently provided to the down switch $SW_{dn}$ 408. This way, the electrical state of the down switch $SW_{dn}$ 408 and the up switch $SW_{up}$ 410 may change substantially simultaneously. In certain embodiments, the selection signal $C_n$ can include a wordline selection signal provided by a wordline decoder. In certain embodiments, the access controller 418 can open the down switch $SW_{dn}$ 408 first, and then subsequently close the up switch $SW_{up}$ 410. This way, the hold voltage source 414 would not accidentally discharge the pre-charge capacitor $C_{pc}$ 402.

Once the pre-charge capacitor $C_{pc}$ 402 is electrically coupled to the high impedance node capacitor $C_g$ 404 through the up switch $SW_{up}$ 410, the pre-charge capacitor $C_{pc}$ 402 would share its charges with the high impedance node capacitor $C_g$ 404. This would equalize the pre-charge voltage $V_{pc}$ and the gate voltage $V_g$, converging at the desired read voltage $V_r$ according to the following equation:

$$V_r = \frac{C_{pc}V_{wr} + C_g V_{hd}}{(C_{pc} + C_g)}$$

In certain embodiments, the pre-charge capacitor $C_{pc}$ 402 can include a parasitic capacitor formed by conductive lines (e.g., wires, traces, etc.). In other embodiments, the pre-charge capacitor $C_{pc}$ 402 can include a capacitor bank. The capacitance of the capacitor bank can be programmed by logic so that the desired read voltage $V_r$ can be programmed by logic.

Figure 6:
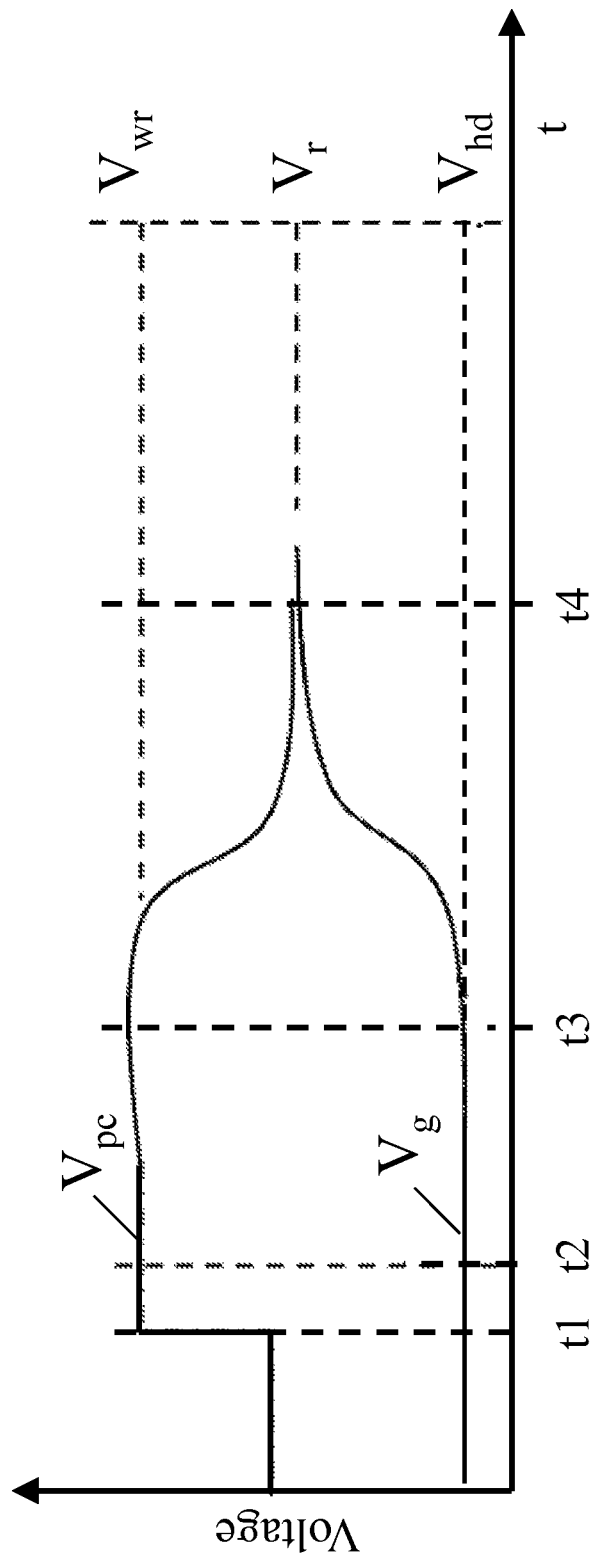
FIG. 6 illustrates changes of voltage in a memory apparatus using a charge sharing technique in accordance with an embodiment of the present disclosure.

FIG. 6 illustrates the voltage signals $V_{pc}$ and $V_g$ during the mode transition from the hold mode to the read mode in accordance with certain embodiments. At t=t1 and t=t2, the access controller 418 configures the switches to provide a floating pre-charge voltage $V_{pc}$ biased at the write voltage $V_{wr}$, while providing the hold voltage $V_{hd}$ to the gate of the memory cell 400.

In certain embodiments, at t=t1, the access controller 418 closes the pre-charge switch $SW_{pc}$ 412 and opens the up switch $SW_{up}$ 410. This operation charges up the pre-charge capacitor $C_{pc}$ 402 to the write voltage $V_{wr}$ while decoupling the pre-charge capacitor $C_{pc}$ 402 from the gate node of the memory cell. Substantially at the same time, the access controller 418 can also close the down switch $SW_{dn}$ 408. This operation keeps the gate voltage $V_g$ at the hold voltage $V_{hd}$. Subsequently, at t=t2, the access controller 418 can open the pre-charge switch $SW_{pc}$ 412 while keeping the configuration of other switches.

In other embodiments, at t=t1, the access controller 418 closes both the pre-charge switch $SW_{pc}$ 412 and the up switch $SW_{up}$ 410, thereby charging the pre-charge capacitor $C_{pc}$ 402 as well as the gate node of the memory cell 400 to the write voltage $V_{wr}$. Substantially at the same time, the access controller 418 can open the down switch $SW_{dn}$ 408, thereby preventing a short between the write voltage source 416 and the hold voltage source 414. At t=t2, the access controller 418 opens both the pre-charge switch $SW_{pc}$ 412 and the up switch $SW_{up}$ 410, thereby providing a floating pre-charge voltage $V_{pc}$ biased at the write voltage $V_{wr}$ at the pre-charge capacitor $C_{pc}$ 402. Substantially at the same time, the access controller 418 can close the down switch $SW_{dn}$ 408, thereby providing the hold voltage $V_{hd}$ to the gate of the memory cell 400. This way, the access controller 418 can provide a floating pre-charge voltage $V_{pc}$ biased at the write voltage $V_{wr}$ while providing the hold voltage $V_{hd}$ to the gate of the memory cell 400.

At t=t3, the access controller 418 opens the down switch $SW_{dn}$ 408 and closes the up switch $SW_{up}$ 410. This would electrically couple the pre-charge capacitor $C_{pc}$ 402 and the high impedance node capacitor $C_g$ 404, therefore, the pre-charge voltage $V_{pc}$ and the gate voltage $V_g$ converge to the desired read voltage $V_r$ by t=t4.

In some embodiments, the switches can include a transmission gate. In other embodiments, the switches can include a pass gate. For example, the down switch $SW_{dn}$ 408 can be formed using an N-type Metal Oxide Semiconductor (NMOS) transistor; the up switch $SW_{up}$ 410 and the precharge switch $SW_{pc}$ 412 can be formed using a P-type Metal Oxide Semiconductor (PMOS) transistor.

In certain embodiments, the write voltage source 416 and the pre-charge switch $SW_{pc}$ 412 can be implemented using a single tri-state logic gate, also known as a tri-state driver. A tri-state logic gate allows an output port of the logic to assume a high impedance state in addition to the "low" and "high" logic levels. Therefore, the tri-state logic gate can provide the write voltage $V_{wr}$ to the pre-charge capacitor $C_{pc}$ 402 when it's in a logical "high" state; the tri-state logic gate can provide the hold voltage $V_{hd}$ to the pre-charge capacitor $C_{pc}$ 402 when it's in a logical "low" state; and the tri-state logic gate can decouple the pre-charge capacitor $C_{pc}$ 402 from the voltage source when it's in a high impedance state.

In certain embodiments, the access controller 418 can be implemented as logic. The logic can be implemented in hardware using an application specific integrated circuit (ASIC), programmable logic array (PLA), or any other integrated circuit. The logic can be synthesized using a hardware description language (HDL), which includes Verilog, Bluespec, Very-high-speed integrated circuits hardware description language (VHDL), Ruby, MyHDL, SystemC, and System Verilog. In other embodiments, the access controller 418 can be implemented in software. The software can be stored in memory such as a non-transitory computer readable medium, a programmable read only memory (PROM), or flash memory. The software can run on a processor that executes instructions or computer code.

Various embodiments of the disclosed apparatuses and methods may be implemented in an integrated circuit device (for example, a discrete memory device or a device having an embedded memory device) including a memory array having a plurality of memory cells arranged in a plurality of rows and columns where each memory cell includes an electrically floating body transistor. The memory arrays may comprise N-channel, P-channel and/or both types of transistors. Indeed, circuitry that is peripheral to the memory array (for example, data sense circuitry (for example, sense amplifiers or comparators), a memory cell selection and control circuitry (for example, wordline and/or source line drivers), as well as row and column address decoders) may include P-channel and/or N-channel type transistors.

Figure 7:
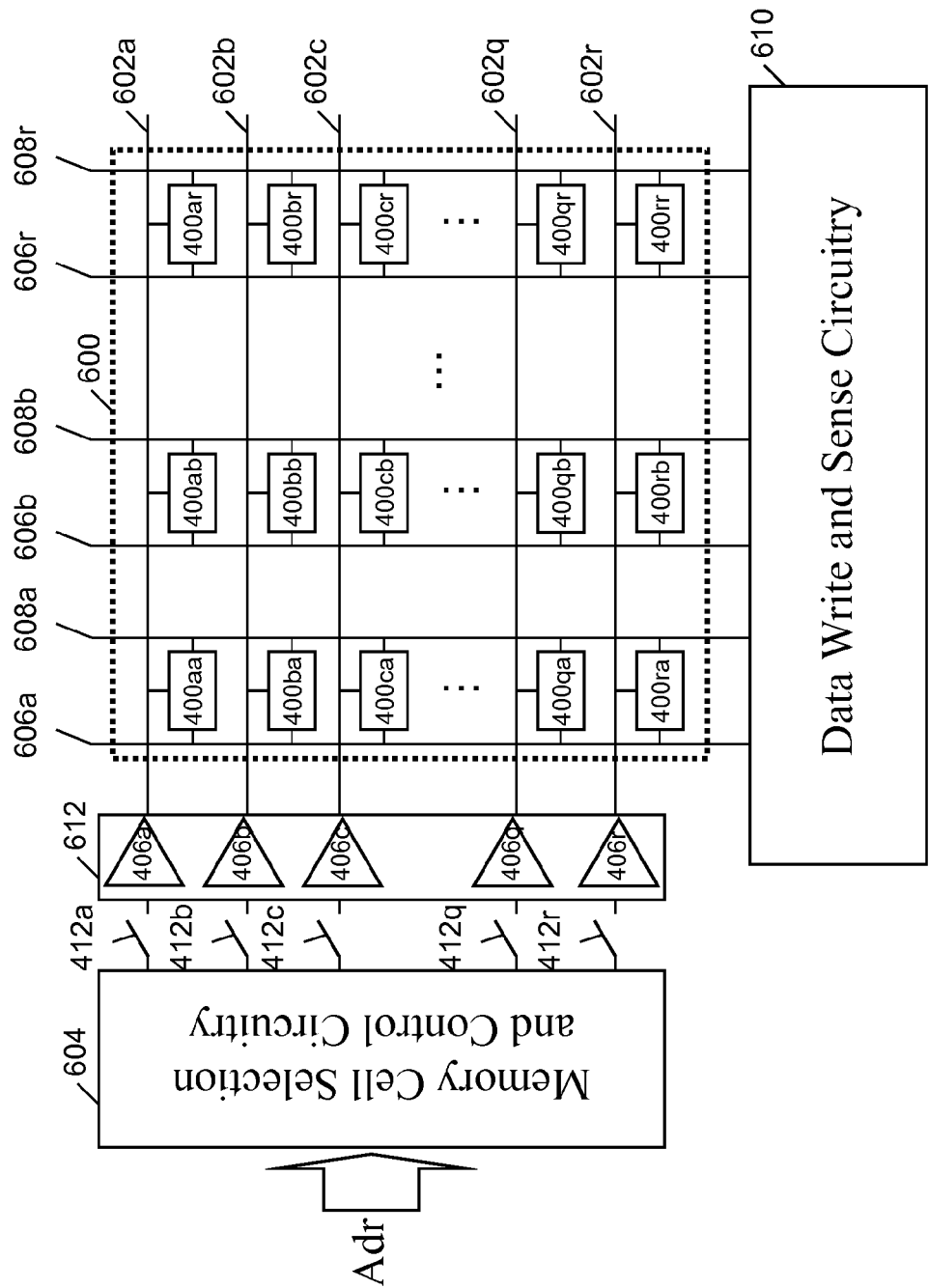
FIG. 7 shows a memory apparatus, with a single-stage wordline decoder, using a charge sharing technique in accordance with an embodiment of the present disclosure.

FIG. 7 shows, in accordance with certain embodiments, an integrated circuit device that includes a memory array 600, having a plurality of memory cells 400, a data write and sense circuitry 610, and a memory cell selection and control circuitry 604. The data write and sense circuitry (DWS) 610 reads data from and writes data to selected memory cells 400. In one embodiment, the DWS 610 includes a plurality of data sense amplifiers. Each data sense amplifier receives at least one bitline 608 and an output of reference generator circuitry (for example, a current or voltage reference signal). In one embodiment, the data sense amplifier may be a cross-coupled type sense amplifier as described and illustrated in U.S. Pat. No. 7,301,838, filed by Waller and Carman on Dec. 12, 2005, and entitled "Sense Amplifier Circuitry and Architecture to Write Data into and/or Read Data from Memory Cells", which is incorporated herein by reference in its entirety.

The data sense amplifier may employ voltage and/or current sensing circuitry and/or techniques. In the context of current sensing, a current sense amplifier may compare the current from the selected memory cell to a reference current, for example, the current of one or more reference cells. From that comparison, it may be determined whether memory cell 400 stores a logic high (relatively more majority carriers contained within body region 108) or a logic low data state (relatively less majority carriers contained within body region 18). The DWS 610 can include one or more sense amplifiers to read the data stored in memory cells 400 and/or write data in memory cells 400.

The memory cell selection and control circuitry (MSC) 604 can select (e.g., enable) one or more predetermined memory cells 400 to facilitate reading data from and/or writing data to the memory cells 400 by providing a control signal on one or more wordlines 602. The MSC 604 may provide such control signals using address data, for example, row address data. Indeed, the MSC 604 may include a conventional wordline decoder and/or driver. The MSC 604 can include the access controller 418 as disclosed in FIG. 4.

There are many different control/selection techniques (and circuitry) to implement the memory cell selection technique. Such techniques, and circuitry, are well known to those skilled in the art. All such control/selection techniques, and circuitry, whether now known or later developed, can be used with the disclosed apparatuses and methods.

The disclosed apparatuses and methods may be implemented in any architecture, layout, and/or configuration comprising memory cells having electrically floating body transistors. For example, in one embodiment, a memory array 600 including a plurality of memory cells 400 having a separate source line 606 for each column of memory cells and having a separate wordline line 602 for each row of the memory cells. The memory array 600 may employ one or more of the example programming, reading and/or holding techniques described above. The wordlines are coupled to a high impedance node of memory cells 400, i.e., the gate node of Z-RAM memory cells. Therefore, the access controller 418 (or the MSC 604 that embodies the access controller 418) can provide the desired voltage to the high impedance node of memory cells 400 by providing the desired voltage to the wordline associated with the memory cells 400.

The memory architecture of FIG. 7 can provide a voltage to a high impedance node of memory cells in accordance with certain embodiments. The wordlines 602 are driven by a wordline driver 612. The wordline driver 612 has a plurality of switch matrices 406, each switch matrix 406 coupled to one wordline 602. When the MSC 604 receives an instruction to read bits from the wordline addressed by an address "Adr," the MSC 604 decodes the address "Adr" to determine which wordline is associated with the address "Adr". Suppose, for illustration, that the address "Adr" is associated with the wordline 602a. Upon decoding the address "Adr", the MSC 604 identifies that the wordline 602a is associated with the input address "Adr." Therefore, the MSC 604 would trigger the switch matrix 406a to provide a read voltage $V_r$ to the wordline 602a.

To trigger the switch matrix 406a to provide the read voltage $V_r$, the access controller 418 (or the MSC 604 that embodies the access controller 418) can sends control signals to the pre-charge switch 412a and the switch matrix 406a, as illustrated with respect to FIGS. 4,5. In FIG. 7, the pre-charge capacitor $C_{pc}$ can include a parasitic capacitor. This parasitic capacitor can be formed by the conductive line between the pre-charge switch $SW_{pc}$ 412 and the up switch $SW_{up}$ 410 in the switch matrix 406a. In other embodiments, the pre-charge capacitor $C_{pc}$ can include a capacitor bank coupled to the conductive line between the pre-charge switch $SW_{pc}$ 412 and the up switch $SW_{up}$ 410 in the switch matrix 406a.

First, the MSC 604 can pre-charge the pre-charge capacitor $C_{pc}$ to the write voltage $V_{wr}$ by coupling the pre-charge capacitor $C_{pc}$ to the write voltage source (i.e., closing the pre-charge switch $SW_{pc}$ 412) and by decoupling the pre-charge capacitor $C_{pc}$ from the wordline 602a (i.e., opening the up switch $SW_{up}$ 410 in the switch matrix 406a.) At the same time, the MSC 604 can close the down switch $SW_{dn}$ 408 in the switch matrix 406*a* so that the wordline 602*a* is pre-charged to the hold voltage $V_{hd}$.

Second, the MSC 604 can open the pre-charge switch $SW_{pc}$ 412, thereby decoupling the pre-charge capacitor $C_{pc}$ from the write voltage source. Third, the MSC 604 can open the down switch $SW_{dn}$ 408 and close the up switch $SW_{up}$ 410. This triggers the charge sharing between the pre-charge capacitor $C_{pc}$ and the wordline 602*a*. This charge sharing provides a read voltage $V_r$ determined by the relative ratio of the pre-charge capacitor's capacitance and the wordline's capacitance. Therefore, the MSC 604 can provide the read voltage $V_r$ to the addressed wordline 602*a* without explicitly generating the read voltage $V_r$ using charge pumps or tank capacitors.

Figure 8:
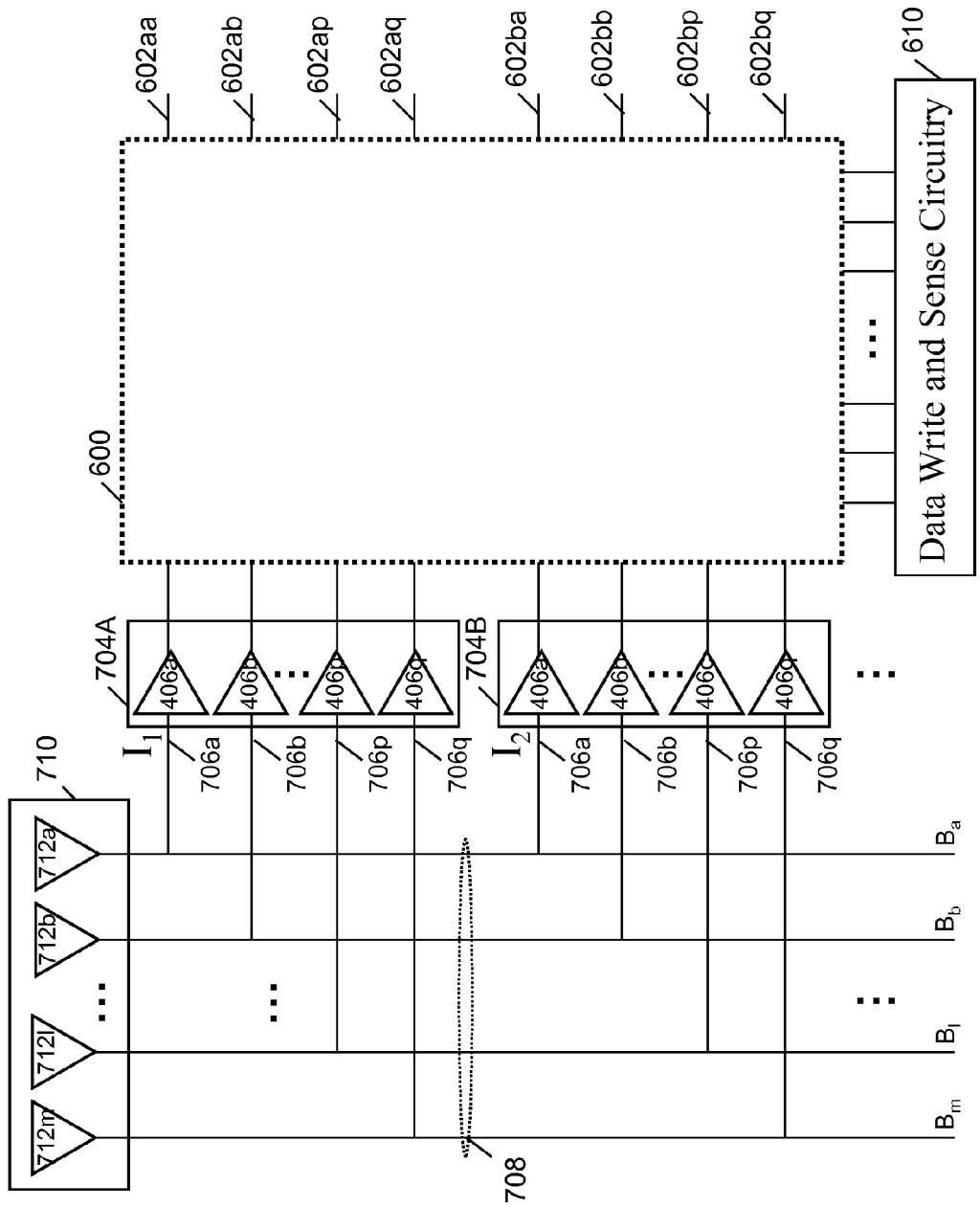
FIG. 8 shows a memory apparatus, with a two-stage wordline decoder, using a charge sharing technique in accordance with an embodiment of the present disclosure.

The charge sharing mechanism can also be used in a multi-level wordline decoding architecture. FIG. 8 illustrates a two-step wordline decoding architecture in accordance with certain embodiments. FIG. 8 includes a wordline bus driver 710, a wordline bus 708, wordline drivers 704, and wordlines 602.

The wordline bus driver 710 can include a plurality of drivers 712 configured as a demultiplexer. Each driver 712 in the wordline bus driver 710 drives one of the signal lines $B_i$ in the wordline bus 708. Each driver 712 can include a tri-state logic gate that can operate as a voltage source and a pre-charge switch, as discussed with respect to FIG. 4.

The wordline drivers 704 can include a plurality of switch matrices 406 also configured as a demultiplexer. Each signal line $B_i$ in the wordline bus 708 is coupled to the $i^{th}$ switch matrix 406 of each wordline driver 704. Also, the $i^{th}$ switch matrix 406 in the $j^{th}$ wordline driver 704 is configured to drive the $i^{th}$ wordline associated with the $j^{th}$ wordline driver $I_j$. The number of switch matrices 406 in the wordline drivers 704 can be $2^k$, where k is an integer. For example, the number of switch matrices 406 in the wordline drivers 704 can be one of 4, 8, 16, 32 etc. The wordline bus driver 710 and the wordline driver 704 can together perform a two-stage address decoding, as described further below.

In certain embodiments, when the memory array is idle (i.e. not being read or programmed), the memory cell selection and control circuitry (MSC) 604 can close the down switch $SW_{dn}$ 408 and open the up switch $SW_{up}$ 410 in all the switch matrices 406. Therefore, when the memory array is idle, the high impedance node of memory cells 400 is coupled to the hold voltage $V_{hd}$, as illustrated in FIG. 4.

When the MSC 604 receives an instruction to access (i.e., read or program) a portion of a memory array, the MSC 604 can send control signals to the associated wordline driver 704 in accordance with the operating mode. For example, when the MSC 604 receives an instruction to write bits to an address "Adr", the MSC 604 can decode the address "Adr" to identify the memory cells 400 associated with the address "Adr." Suppose, for illustration, that the address "Adr" is associated with memory cells coupled to the first wordline 602*ba* of the second wordline driver $I_2$ 704B. The MSC 604 would perform the following operations to provide the write voltage $V_{wr}$ to the first wordline 602*ba* of the second wordline driver $I_2$ 704B.

First, the MSC 604 can trigger the wordline bus driver 710 to provide the write voltage $V_{wr}$ to the first signal line $B_a$. Second, the MSC 604 can trigger the wordline bus driver 710 to provide the hold voltage $V_{hd}$ to all other signal lines on the wordline bus 708. The first and second steps would provide the write voltage $V_{wr}$ to the first signal line $B_a$, and provide the hold voltage $V_{hd}$ to every other signal lines on the wordline bus 708.

Third, the MSC 604 can send control signals to the switch matrices 406 in the second wordline driver $I_2$ 704B to control their switch configurations. The MSC 604 can send the same control signals to all the switch matrices 406 in the second wordline driver $I_2$ 704B. The control signals can include a first control signal that opens the down switch $SW_{dn}$ 408 of switch matrices and a second control signal that closes the up switch $SW_{up}$ 410 of switch matrices. Because only the first signal line $B_a$ carries the write voltage $V_{wr}$, only the first wordline 602*ba* of the second wordline driver $I_2$ 704B would receive the write voltage $V_{wr}$; other wordlines 602*bb*-602*bq* of the second wordline driver $I_2$ 704B would receive the hold voltage $V_{hd}$. Therefore, these three steps would provide the write voltage $V_{wr}$ to the high impedance node of the memory cells associated with the address "Adr".

The MSC 604 can perform similar steps to read bits from the address "Adr." Suppose, for illustration, that the address "Adr" is associated with memory cells coupled to the first wordline 602*ba* of the second wordline driver $I_2$ 704B. Therefore, the MSC 604 initiates the read process to provide the read voltage $V_r$ to the first wordline 602*ba* of the second wordline driver $I_2$ 704B. First, the MSC 604 can trigger the wordline bus driver 710 to provide the write voltage $V_{wr}$ to the first signal line $B_a$. This charges up the parasitic capacitance $C_{pc}$ 402 of the first signal line $B_a$ to the write voltage $V_{wr}$. The MSC 604 can also open the up switch $SW_{up}$ 410 and close the down switch $SW_{dn}$ 408 of all switch matrices to provide the hold voltage $V_{hd}$ to all the wordlines.

Second, the MSC 604 can trigger the wordline bus driver 710 to provide the hold voltage $V_{hd}$ to all other signal lines on the wordline bus 708. This would charge up the parasitic capacitance $C_{pc}$ 402 of these signal lines to the hold voltage $V_{hd}$.

Third, the MSC 604 can decouple the wordline bus 708 from the wordline bus driver 710, thereby floating the wordline bus 708. However, the charge maintained in the wordline bus's parasitic capacitor would remain. Therefore, the voltage on the first signal line $B_a$ would remain at the write voltage $V_{wr}$; the voltage on other signal lines would remain at the hold voltage $V_{hd}$.

Fourth, the MSC 604 can send control signals to switch matrices 406 in the second wordline driver $I_2$ 704B. The MSC 604 can send the same control signals to all the switch matrices 406 in the second wordline driver $I_2$ 704B. The control signals can include a first control signal that opens the down switch $SW_{dn}$ 408 of the switch matrices and a second control signal that closes the up switch $SW_{up}$ 410 of the switch matrices. This triggers the parasitic capacitor $C_{pc}$ 402 of the first signal line $B_a$ to share its charge with the wordline 602*ba*, as illustrated in FIGS. 4,5. The parasitic capacitors $C_{pc}$ 402 of the other signal lines do not necessarily share charges with the associated wordlines because both the parasitic capacitors $C_{pc}$ 402 and the associated wordlines are at the hold voltage $V_{hd}$. Therefore, the four steps illustrated above can provide the read voltage $V_r$ to the memory cells addressed by "Adr," while providing the hold voltage $V_{hd}$ to other memory cells.

In certain embodiments, the MSC 604 can control the value of the read voltage $V_r$ by configuring the pre-charge capacitor to provide a selected capacitance. The capacitance of the pre-charge capacitor can be selected by selectively coupling a capacitor bank to the wordline bus 708. The capacitor bank can be implemented using one or more dummy wordlines. For example, the memory array can include four dummy wordlines, each coupled to one or more dummy memory cells, and each dummy wordline can have an effective capacitance that is one quarter of regular wordline's capacitance. By selectively coupling one or more of these dummy wordlines to the wordline bus 704, the capacitance of the pre-charge capacitor can be configured in steps of ¼ of wordline's capacitor.

At this point it should be noted that apparatuses and methods for programming and reading memory cells in accordance with the present disclosure as described above may involve the processing of input data and the generation of output data to some extent. This input data processing and output data generation may be implemented in hardware or software. For example, specific electronic components may be employed in a computer apparatus or similar or related circuitry for implementing the functions associated with apparatuses and methods for programming and reading memory cells in accordance with the present disclosure as described above. Alternatively, one or more processors operating in accordance with instructions may implement the functions associated with apparatuses and methods for programming and reading memory cells in accordance with the present disclosure as described above. If such is the case, it is within the scope of the present disclosure that such instructions may be stored on one or more non-transitory processor readable storage media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. For example, a high impedance node of a memory cell is not limited to a gate node of a Z-RAM cell. A high impedance node of a memory cell includes any nodes, in a memory cell, that does not have any low impedance pathways to other nodes. Such a high impedance node can be coupled to a resistor with a high resistance or a capacitor.

Further, although the present disclosure has been described herein in the context of at least one particular implementation in at least one particular environment for at least one particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A memory apparatus comprising:
a precharge capacitor;
a switching system coupled to the precharge capacitor, first and second voltage source nodes, and a memory cell; and
an access controller configured to control the switching system to provide selected voltage levels to the memory cell to cause the memory cell to operate in a hold mode wherein the memory cell maintains a data state, a read mode wherein a data state is read from the memory cell, a first write mode wherein a logical low data state is written to the memory cell, and a second write mode wherein a logical high data state is written to the memory cell.

2. The apparatus of claim 1, wherein the memory cell comprises a zero-capacitor random access memory (Z-RAM) cell.

3. The apparatus of claim 2, wherein the selected voltage levels are provided to a gate node of the Z-RAM cell.

4. The apparatus of claim 3, wherein the gate node is a high impedance node having a gate capacitance.

5. The apparatus of claim 1, wherein the first voltage source node is configured to provide a write voltage to the memory cell and the second voltage source node is configured to provide a hold voltage to the memory cell.

6. The apparatus of claim 1, wherein the precharge capacitor comprises a parasitic capacitor of a conductive signal line.

7. The apparatus of claim 1, wherein the precharge capacitor comprises a capacitor formed by a dummy wordline coupled to the memory cell.

8. The apparatus of claim 1, wherein in the hold mode of operation the access controller is configured to trigger the switching system to couple the first voltage source node to the precharge capacitor and to couple the second voltage source node to the memory cell.

9. The apparatus of claim 1, wherein in the read mode of operation the access controller is configured to trigger the switching system to decouple the first voltage source node from the precharge capacitor and to couple the precharge capacitor to the memory cell.

10. The apparatus of claim 1, wherein in the first write mode of operation the access controller is configured to trigger the switching system to couple the first voltage source node to the precharge capacitor and the memory cell.

11. The apparatus of claim 1, wherein in the hold mode of operation the access controller is configured to trigger the switching system to decouple the first voltage source node from the precharge capacitor, to decouple the memory cell from the precharge capacitor, and to couple the memory cell to the second voltage source node.

12. The apparatus of claim 1, wherein in the read mode of operation the access controller is configured to trigger the switching system to decouple the memory cell from the second voltage source and to couple the precharge capacitor to the memory cell.

13. The apparatus of claim 1, wherein the switching system comprises a first switch and a second switch, wherein the first switch and the second switch are connected in series, and wherein a first node of the first switch is coupled to the precharge capacitor, a first node of the second switch is coupled to the second voltage source node, and a common node of the first switch and the second switch is coupled to the memory cell.

14. The apparatus of claim 13, wherein the switching system further comprises a precharge switch, wherein a first node of the precharge switch is coupled to the precharge capacitor and a second node of the precharge switch is coupled to the first voltage source node.

15. The apparatus of claim 14, wherein the first node of the first switch and the first node of the precharge switch are a common node.

16. The apparatus of claim 14, wherein the precharge switch comprises a tri-state logic gate.

17. The apparatus of claim 14, wherein the precharge switch comprises a transmission gate.

18. The apparatus of claim 1, wherein the precharge capacitor comprises a wordline bus.

19. The apparatus of claim 18, wherein the switching system comprises a first demultiplexer configured to drive signals onto the wordline bus.

20. The apparatus of claim 19, wherein the switching system further comprises a second demultiplexer configured to couple the wordline bus to the memory cell.

* * * * *